(12) United States Patent
Pio et al.

(10) Patent No.: US 6,618,315 B2
(45) Date of Patent: Sep. 9, 2003

(54) NON-VOLATILE, ELECTRICALLY ALTERABLE SEMICONDUCTOR MEMORY

(75) Inventors: Federico Pio, Brugherio (IT); Enrico Gomiero, Padua (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/057,769

(22) Filed: Jan. 24, 2002

(65) Prior Publication Data

US 2002/0154546 A1 Oct. 24, 2002

(30) Foreign Application Priority Data

Jan. 24, 2001 (EP) .............................. 01830039

(51) Int. Cl.[7] ................................. G11C 7/00
(52) U.S. Cl. ........................... 365/230.01; 365/230.03; 365/230.06; 365/230.08; 365/218; 365/189.01; 365/63
(58) Field of Search ............................. 365/189.01, 63, 365/218, 230.01, 230.03, 230.06, 230.08

(56) References Cited

U.S. PATENT DOCUMENTS

| | | | |
|---|---|---|---|
| 5,617,359 A | | 4/1997 | Ninomiya |
| 6,304,504 B1 | * | 10/2001 | Chevallier et al. .......... 365/201 |
| 6,401,167 B1 | * | 6/2002 | Barth et al. .................. 711/106 |
| 6,459,641 B2 | * | 10/2002 | Fujioka et al. .............. 365/220 |
| 6,473,339 B2 | * | 10/2002 | De Ambroggi et al. .. 365/185.09 |
| 2002/0154546 A1 | * | 10/2002 | Pio et al. ................ 365/185.28 |

FOREIGN PATENT DOCUMENTS

EP  0 477 938 A2  4/1992

OTHER PUBLICATIONS

European Search Report from European patent application No. 01830039 filed Jan. 24, 2001.

* cited by examiner

Primary Examiner—Viet Q. Nguyen
(74) Attorney, Agent, or Firm—Lisa K. Jorgenson; Allen, Dyer, Doppelt, Milbrath & Gilchrist, P.A.

(57) ABSTRACT

Non-volatile, electrically alterable semiconductor memory, including at least one two-dimensional array of memory cells with a plurality of rows and a plurality of columns, column selection circuitry for selecting columns among the plurality of columns, and a write circuit for simultaneously writing a first number of memory cells. A plurality of doped semiconductor regions is provided, extending transversally to the rows and subdividing a set of memory cells of each row in a corresponding plurality of subsets of memory cells, each subset of memory cells including memory cells of the row formed in a respective doped semiconductor region distinct from the remaining doped semiconductor regions and defining an elementary memory block that can be individually erased. The plurality of doped semiconductor regions define a plurality of column packets each one containing a second number of columns equal to or higher than the first number, memory cells belonging to columns of a same column packet being formed in a same doped semiconductor region distinct from the doped semiconductor regions in which memory cells belonging to columns of the other column packets are formed. The column selection circuits are such that within each column packet columns containing memory cells that can be written simultaneously by the write circuit are distributed among the columns of the column packet so as to be at the substantially maximum distance from each other allowable within the column packet.

14 Claims, 5 Drawing Sheets

NON-VOLATILE, ELECTRICALLY ALTERABLE SEMICONDUCTOR MEMORY

FIELD OF THE INVENTION

The present invention relates generally to the field of semiconductor memory devices, and more particularly to non-volatile memories. Still more particularly, the invention relates to electrically erasable and programmable non-volatile memories such as Flash memories.

BACKGROUND OF THE INVENTION

Typically, Flash memories offer the possibility of writing data per single Bytes or words (of two or multiple of two Bytes). On the contrary, when even a single data Byte or word stored in the memory is to be modified, it is necessary to erase the information stored in the whole memory or, at the best, in a whole memory sector containing such Byte or word.

This is a significant disadvantage of Flash memories. In fact, even if memory sectors are provided, the minimum memory sector size that can be practically achieved, at a reasonable cost in terms of semiconductor chip area, is of some Kbytes. This means that when a given data Byte or word belonging to a given memory sector is to be modified, the whole memory sector, that is some Kbytes of memory space, must be erased and then rewritten.

This limits the otherwise highly desirable use of Flash memories in those applications which require often to modify single data Bytes or words.

In the co-pending European Patent Application No. 00830553.4, filed on Aug. 2, 2000 in the name of the same Applicant of the present application, and incorporated herein by reference, a semiconductor memory is described which overcomes the above drawback, offering the possibility of being not only written, but also erased per single data words.

Briefly, let a two-dimensional array of memory cells be considered, which can be the whole memory matrix or a memory sector of a Flash memory. The memory cells are conventionally arranged in rows (word lines) and columns (bit lines).

Instead of forming all the memory cells of the two-dimensional array within a single doped semiconductor region, normally of P conductivity type for N-channel memory cells, formed in turn in an N conductivity type well, a plurality of P type doped semiconductor regions are provided in the N type well. The P type doped semiconductor regions of said plurality are in the form of stripes which extend side by side transversally to the rows, under the columns.

The columns are thus grouped in packets. Memory cells belonging to columns of a same column packet are formed in a same one of said P type doped semiconductor stripes. Thus, the set of memory cells of each row is subdivided into a plurality of sub-sets of memory cells, each sub-set containing those memory cells which are formed in a same one of said P type doped semiconductor stripes.

While in writing a Byte granularity is maintained, by providing circuitry capable of selectively biasing in erasing the P type doped semiconductor stripes and rows, it is thus possible to selectively erase only the memory cells belonging to one of said sub-sets of a selected row.

The elementary memory block that can be individually erased is thus formed by one of said sub-sets of memory cells defined by the intersection of a given row with one of said P type doped semiconductor stripes. Said elementary memory block, also referred to as "memory page", can for example contain eight, sixteen, thirty-two or sixty-four memory cells, depending on the width of the doped semiconductor stripes.

In the memory described above, which in the following will be referred to as "page Flash", all the bits of a given memory page or word are physically adjacent to each other, being formed in a same P type doped semiconductor stripe. On the contrary, in a conventional Flash memory the bits of a given memory word are topologically spaced apart from each other. For example, let a Flash memory be considered having a memory sector made up of 256 rows and 2048 columns, with memory locations of the width of a sixteen bit word. When a given memory location is selected, one row and sixteen columns of the memory sector are selected. The selected sixteen columns are spaced apart from each other of (2048/16)=128 columns. In other words, since in a conventional Flash memory the memory sector dimension is much higher than that of a column packet in the page Flash, the former allows a much better spatial distribution the bits making up each memory word than the latter.

Due to this, a page Flash memory is affected by a problem in the writing (programming) operation. As known, Flash memory cells are programmed by means of the CHE ("Channel Hot Electrons") physical mechanism, producing charge carriers of sufficiently high energy to overcome the potential barrier of the dielectric interposed between the substrate and the floating gate, so as to charge the latter. To trigger such a mechanism, current is forced through the memory cells' channel by applying a high drain and a high control gate voltage, with source grounded, while the memory cells' bulk (substrate) is biased at a voltage equal to ground or negative to increase efficiency. It occurs that charge carriers are injected into the substrate from a region of the cells' channel near to the drain thereof. The injected carriers give rise to a substrate current, that causes a voltage drop between the carriers injection region and the region of the substrate where the substrate bias voltage is applied (substrate contact). Such a voltage drop modifies the effective biasing of the memory cell.

In particular, the farther the memory cell to be programmed from substrate contact, the higher the voltage drop caused by the substrate current, and the less efficient the programming action. Consequently, for a fixed programming pulse length, the resulting memory cell threshold voltage comes to depend on the memory cell position within the memory word.

Additionally, for a superposition of effects, the voltage drop in the substrate at a given point (for example, in correspondence of a memory cell) is also affected by the voltage drop induced by the other memory cells which are simultaneously submitted to programming. So, the voltage drop is higher the higher the number of memory cells programmed in parallel and the shorter the distance between the memory cells to be programmed.

As a consequence, the effect described above depends also on the kind of logic information to be written in the memory word, that is, assuming that a logic "0" corresponds to a written cell, on the number of "0"s contained in the data word to be programmed, and on the distribution of said "0"s within the data word.

In order to limit the effects of the voltage drop in the substrate, it would be necessary to limit the number of memory cells that can be programmed simultaneously, and/or to set the memory cells to be programmed in parallel spatially apart from each other.

Clearly, the first solution is highly undesirable, since it lengthens the programming time of the memory matrix.

A page Flash, in which as discussed all the bits of any memory word are physically adjacent, is particularly affected by the above mentioned problem, because the distance between the memory cells (bits) to be programmed in parallel is quite small (equal to the pitch of a single memory cell along a row) compared to the distance in a conventional Flash memory.

SUMMARY OF THE INVENTION

In view of this state of the art, it is an object of the present invention to provide a memory structurally and functionally adapted to overcome at least the above mentioned problems.

According to the present invention, such an object is achieved by a non-volatile, electrically alterable semiconductor memory, comprising at least one two-dimensional array of memory cells with a plurality of rows and a plurality of columns, column selection means for selecting columns among said plurality of columns, and a write circuit for simultaneously writing a first number of memory cells, comprising:

- a plurality of doped semiconductor regions extending transversally to the rows and subdividing a set of memory cells of each row in a corresponding plurality of subsets of memory cells, each subset of memory cells including memory cells of the row formed in a respective doped semiconductor region distinct from the remaining doped semiconductor regions and defining an elementary memory block that can be individually erased;
- a plurality of column packets each one containing a second number of columns, said second number being equal to or higher than the first number, memory cells belonging to columns of a same column packet being formed in a same doped semiconductor region distinct from the doped semiconductor regions in which memory cells belonging to columns of the other column packets are formed, said column selection means being such that, within each column packet, columns containing memory cells that can be written simultaneously by the write circuit are distributed among the columns of the column packet so as to be at the substantially maximum distance from each other allowable within the column packet.

BRIEF DESCRIPTION OF THE DRAWINGS

The features and advantages of the present invention will be made apparent by the following detailed description of possible practical embodiments thereof, illustrated merely by way of example in the annexed drawings, wherein.

DETAILED DESCRIPTION

Figure 1:
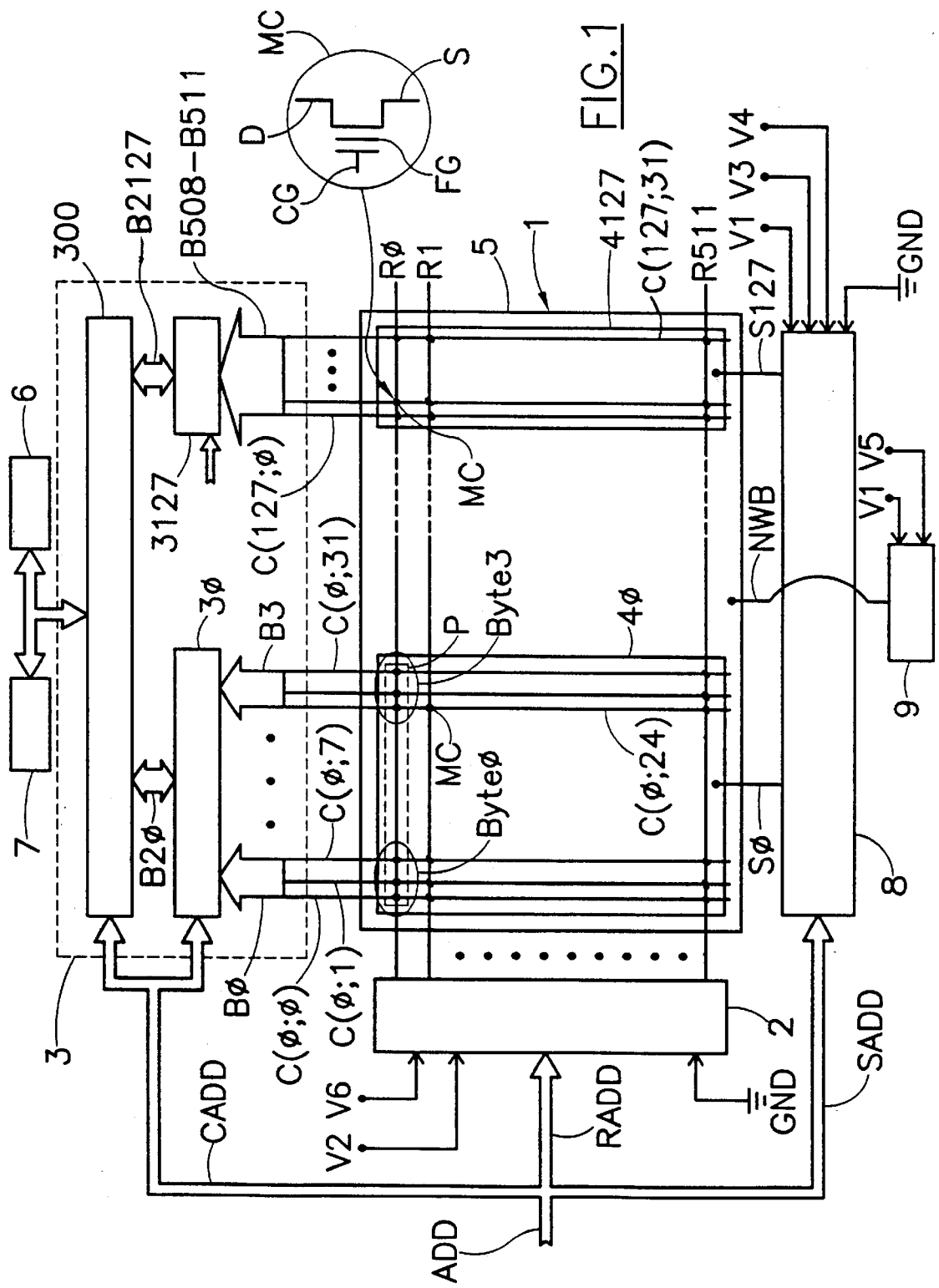
FIG. 1 is a schematic diagram of a page Flash memory.

With reference to FIG. 1, a page Flash memory as described in the above cited European Patent Application No. 00830553.4 is shown. The memory comprises a two-dimensional array 1 of memory cells, arranged in (e.g.,512) rows R0–R511 and (e.g., 4096) columns C(0;0)–C(127;31). At each intersection between a row and a column, a memory cell MC is provided. The memory cells MC are conventionally formed by stacked-gate MOS transistors with a control gate electrode CG connected to the respective row, an electrically insulated floating gate electrode FG, a drain electrode D connected to the respective column, and a source electrode S.

Figure 2:
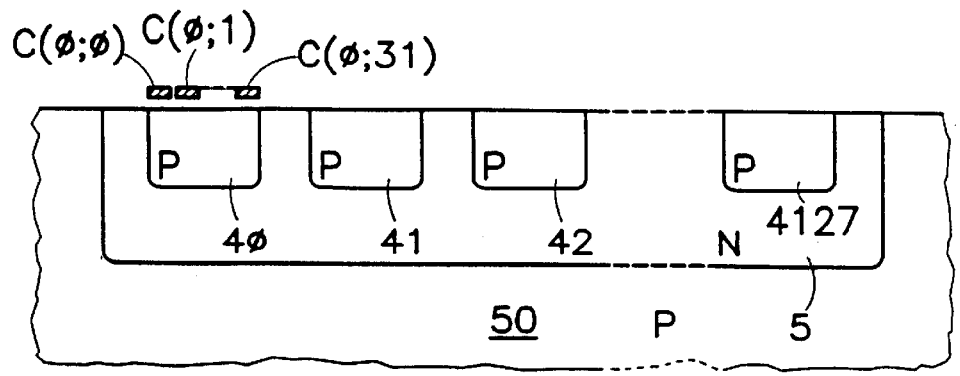
FIG. 2 is a schematic diagram of a memory cell array of the memory of FIG. 1, sectioned in a plane perpendicular to the drawing and parallel to rows of the memory cell array.

Referring jointly to FIGS. 1 and 2, the memory cells MC are formed inside semiconductor regions 40–4127 (128 in the shown example), doped of a first conductivity type, for example P type, which extend transversally to the rows. The doped semiconductor regions 40–4127, each of which spans across all the rows R0–R511, are arranged side by side.

The doped semiconductor regions 40–4127, which in the following will be also briefly referred to as "stripes", are formed inside a common N type doped semiconductor well 5, which in turn is formed inside a P type semiconductor chip 50.

The plurality of 4096 columns is thus made up of 128 packets of thirty-two columns each A row address decoder and row selection circuit block 2 receives from a bus ADD of address signal lines row address signal lines RADD. Block 2 decodes a digital code carried by the row address signal lines RADD and selects, among the plurality of rows R0–R11, one row corresponding to the digital code, providing the required bias voltage, that depends on the memory operation mode, to both the selected row and the unselected rows.

A column address decoder and column selection circuit block 3 receives from bus ADD column address signal lines CADD. Block 3 comprises a plurality (128 in the shown example) of first-level decoder and selection circuit blocks 30–3127, each one associated with a respective column packet, for selecting for example one group of eight columns (B0–B3)-(B508–B511) among the thirty-two columns of each column packet.

Block 3 further comprises a second-level decoder and selection circuit block 300 for selecting one group of eight columns B20–B2127 among the 128 groups of eight columns provided at the output of the first-level circuit blocks 30–3127.

Through block 3, one group of eight columns among the 512 groups of eight columns B0–B511 can be selectively electrically coupled to a sensing circuitry 6 or to a programming circuitry 7.

It should be noted that the actual number of the groups of columns that can be selected by blocks 30–3127 and 300 only depends on the degree of parallelism of the sensing and programming circuitries. In the above example, it has been assumed that such a degree of parallelism is equal to eight; memories with a degree of parallelism equal to sixteen are also conventional: in such a case the number of columns in each group that can be selected by blocks 30–3127 and 300 will be equal to sixteen instead of eight.

A stripe address decoder and stripe selection circuit block 8 receives from bus ADD stripe address signal lines SADD. Block 8 decodes a digital code carried by the stripe address signal lines and selects, among the plurality of stripes 40–4127, one stripe corresponding to the digital code, providing the required bias voltages (through bias lines S0–S127), that depends on the memory operation mode, to both the selected stripe and the unselected stripes.

A circuit block 9 supplies through a bias line NWB the proper bias voltage, also depending on the memory operation mode, to the N type well 5.

By virtue of the structure so far described, the elemental memory unit the content of which can be modified individually, that is, which can be individually erased, is constituted by a sub-set of (thirty-two, in the shown example) memory cells MC of the set of (4096 in the example) memory cells of a given row R0–R511, said sub-set including the memory cells MC of said row that are formed in a same stripe 40–4127. Said sub-set therefore includes the memory cells which belong to columns of a same column packet (C(0;0)–C(0;31))-(C(127;0)–C(127;31)).

Said elemental memory unit is also referred to as "memory page" or, briefly, "page" P. In the shown example, the memory is thus made up of $2^{16}$ pages P, and since each page contains thirty-two memory cells, each memory page has the size of a so-called "long-word". This is purely an example, in no way limiting, since the size of the elemental memory units may vary in dependence of the particular embodiment and may, for example, be equal to eight bits(one Byte), to sixteen bits (a word), to sixty-four bits, or even to other sizes as required by the particular application. The elemental memory unit can as well include additional bits for implementing fail correction techniques based on Error Correction Codes (ECC), and/or bits, to be used as flags, for implementing security access schemes.

Figure 3:
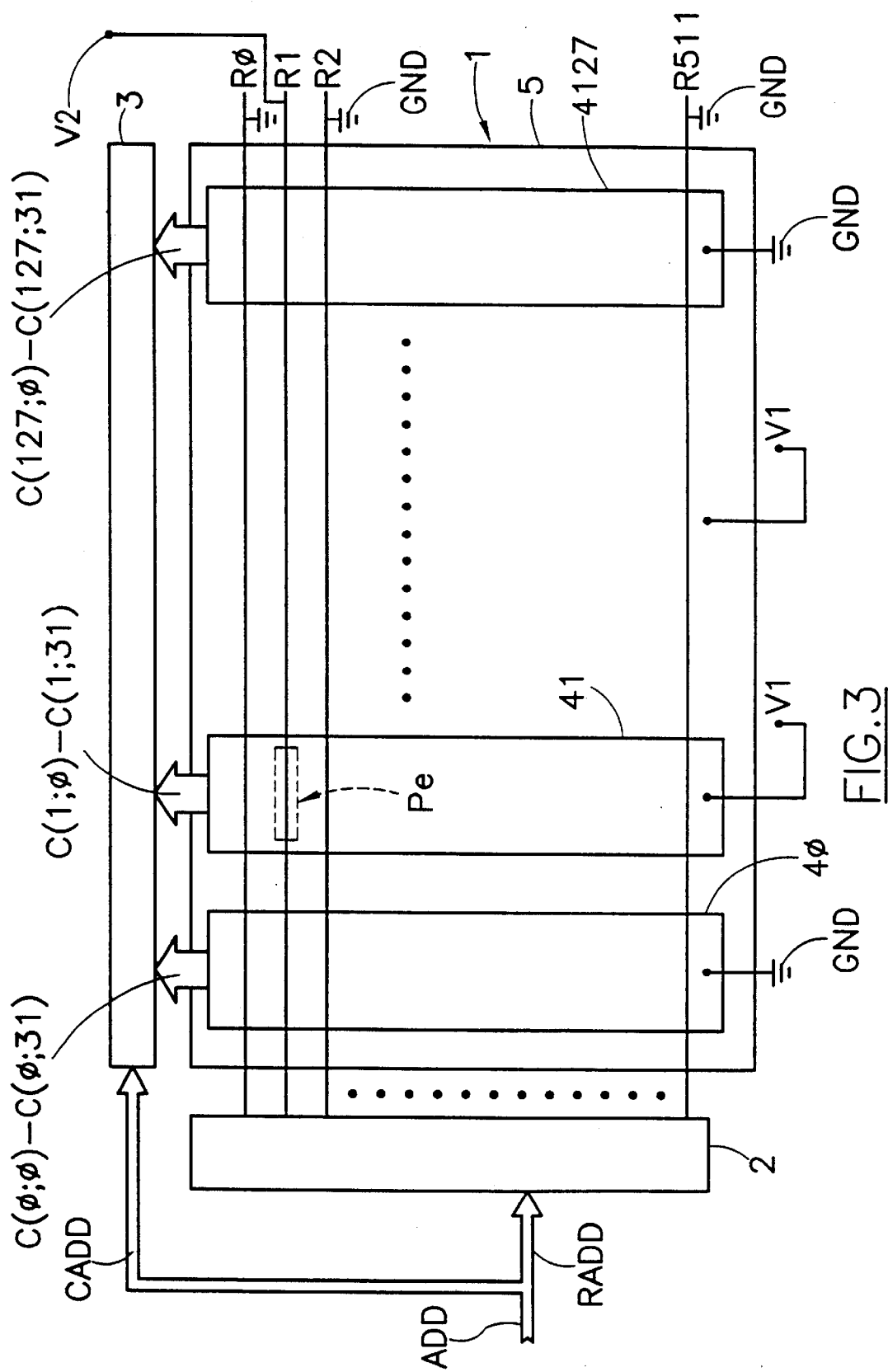
FIGS. 3 and 4 are schematic diagrams of the page Flash memory of FIG. 1 with indicated biasing voltages used in a memory word erase and write operations, respectively.
Figure 4:
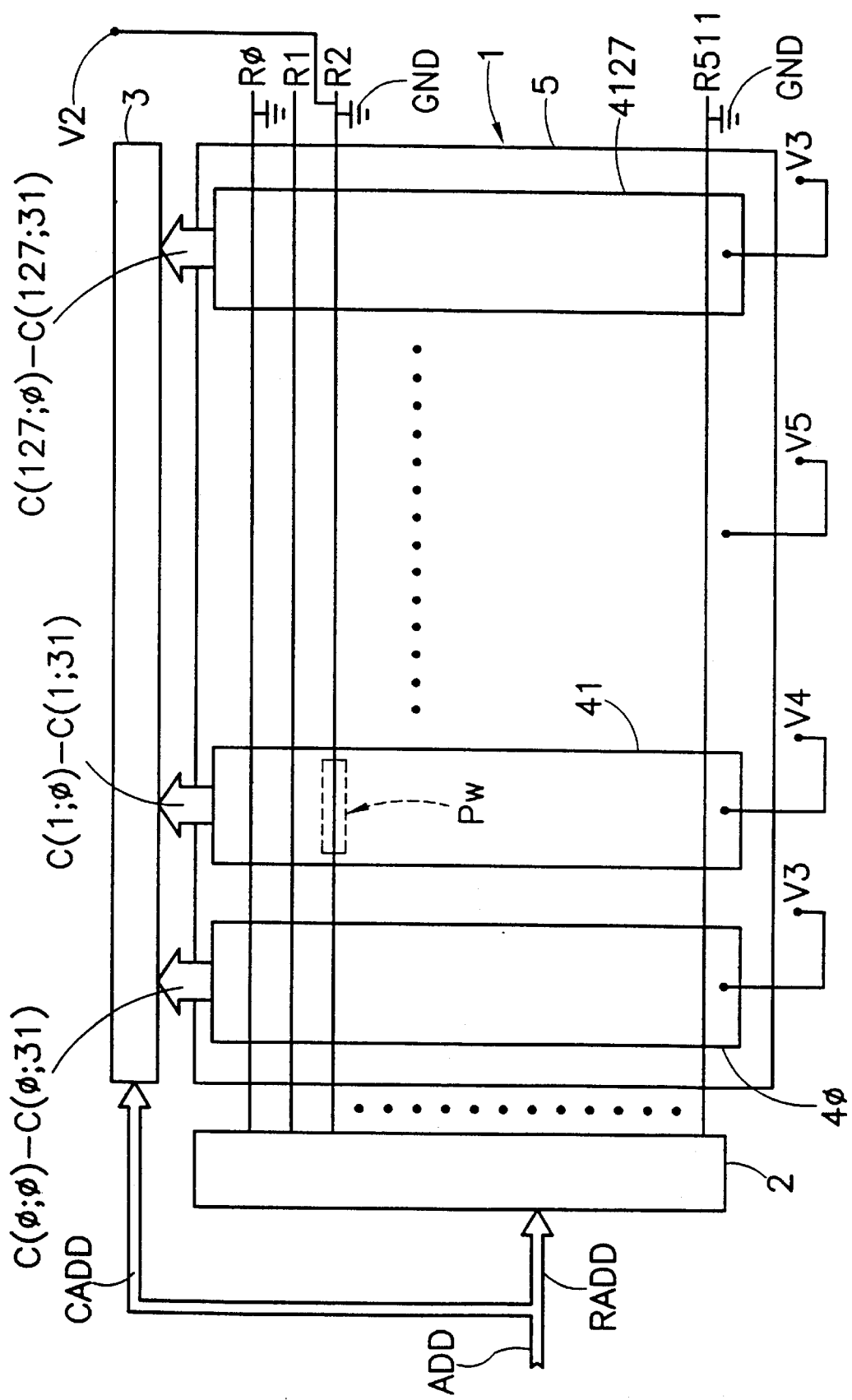

FIGS. 3 and 4 show the page Flash memory of FIG. 1 during an erase operation and, respectively, a write operation.

Specifically, FIG. 3 relates to an erase operation of an elemental memory unit or page Pe formed by memory cells belonging to row R1 and to columns C(1;0)–C(1;31) (the second column packet).

Block 2 biases row R1 to a voltage V2, for example a negative voltage equal to approximately −8V (erase voltage). The other rows R0 and R2–R511 are biased to ground (GND) or to a low positive voltage, e.g. 2V.

Block 8 biases stripe 41 to a relatively high positive voltage V1, for example 8V. The remaining stripes 40 and 42–4127 are biased to a suitably low voltage, for example to ground. The source electrode of the memory cells formed inside a given stripe 40–4127 are kept at a potential substantially corresponding to the biasing potential of the respective stripe: the source electrodes of the memory cells inside stripe 41 are biased to voltage V1, those of the cells of the remaining stripes are biased to ground.

Block 9 biases the N type well 5 to a positive voltage, for example to voltage V1.

Block 3 leaves all the columns C(0;0)–C(127;31) floating.

In spite of the fact that the entire row R1 is biased to the erase voltage V2, only those memory cells of row R1 which are formed inside stripe 41 (biased to voltage V1) are subjected to an electric field favorable to the removal of the charges trapped in the floating gates thereof. Thus, only the memory cells of page Pe are erased.

FIG. 4 relates to a write operation of a page Pw formed by memory cells belonging to row R2 and to columns C(1;0)–C(1;31) (the second column packet).

Block 2 biases row R2 to a relatively high positive voltage V6, for example 8V or 9V. The remaining rows R0, R1 and R3–R511 are biased to ground.

Block 8 biases stripe 41 to a voltage V4, for example ground or a slightly negative voltage, such as −1.2V. The remaining stripes 40 and 42–4127 are biased to a voltage V3, for example ground or a low positive voltage, such as 2V. The source electrodes of the memory cells formed inside stripe 41 are biased to ground, while those of the memory cells formed inside the other stripes 40 and 42–4127 are biased to voltages substantially corresponding to the biasing voltages of the respective stripes, ie., V3.

Block 3 couples the columns of the second column packet, associated with stripe 41, to the programming circuitry 7. The voltage to which each column of the selected packet is biased depends on the datum to be written in the corresponding memory cell (logic "1" or "0"), on the technology used for the manufacture of the memory and on specific application. Assuming by mere convention that a logic "0" corresponds to a written memory cell, to store a "0" into a memory cell the memory cell should be written, and the voltage applied to the drain thereof should be in the voltage range 2V to 6V. On the contrary, to store a logic "1" the memory cell should not be written: in this case the corresponding column is left floating.

Block 9 biases the N type well 5 to a positive voltage V5 equal to or greater than voltage V3 so as to reverse bias the PN junction formed by P stripe 41 and N well 5. Voltage V5 can for example be the main supply voltage (Vdd) of the memory as a whole.

Only those memory cells belonging to row R2 and to columns C(1;0)–C(1;31) are thus written or left unwritten in accordance with the data to be stored.

The structure so far described corresponds to the one described in the already cited European Patent Application No. 00830553.4.

As discussed in the introduction of this description, the problem with such a structure is that all the bits of a given memory Byte or word are physically adjacent to each other, being formed in a same P type doped semiconductor stripe. For example, referring back to FIG. 1, and considering page P, the bits of the first Byte Byte0 belong to the first eight columns C(0;0)–C(0;7) of the column packet, those of the second Byte to the second eight columns, and so on, the bits of the fourth Byte Byte3 belong to the last eight columns C(0;24)–C(0;31). The problem is that, supposing that the memory is designed to have a degree of parallelism of eight, so that eight memory cells can be written simultaneously, when Byte Byte0 is to be written with all "0"s all the first eight memory cells (Byte0) will inject current into the P type stripe 40 (the memory cell's bulk or substrate), and a significant change in the substrate voltage seen by each memory cell takes place. The problem is even exacerbated if the memory has a degree of parallelism of sixteen: in this case, it can happen that all the first sixteen memory cells (Byte0 and Byte1) inject current into the P type stripe 40.

In order to overcome such a problem, the present invention provides the following solution.

Figure 5:
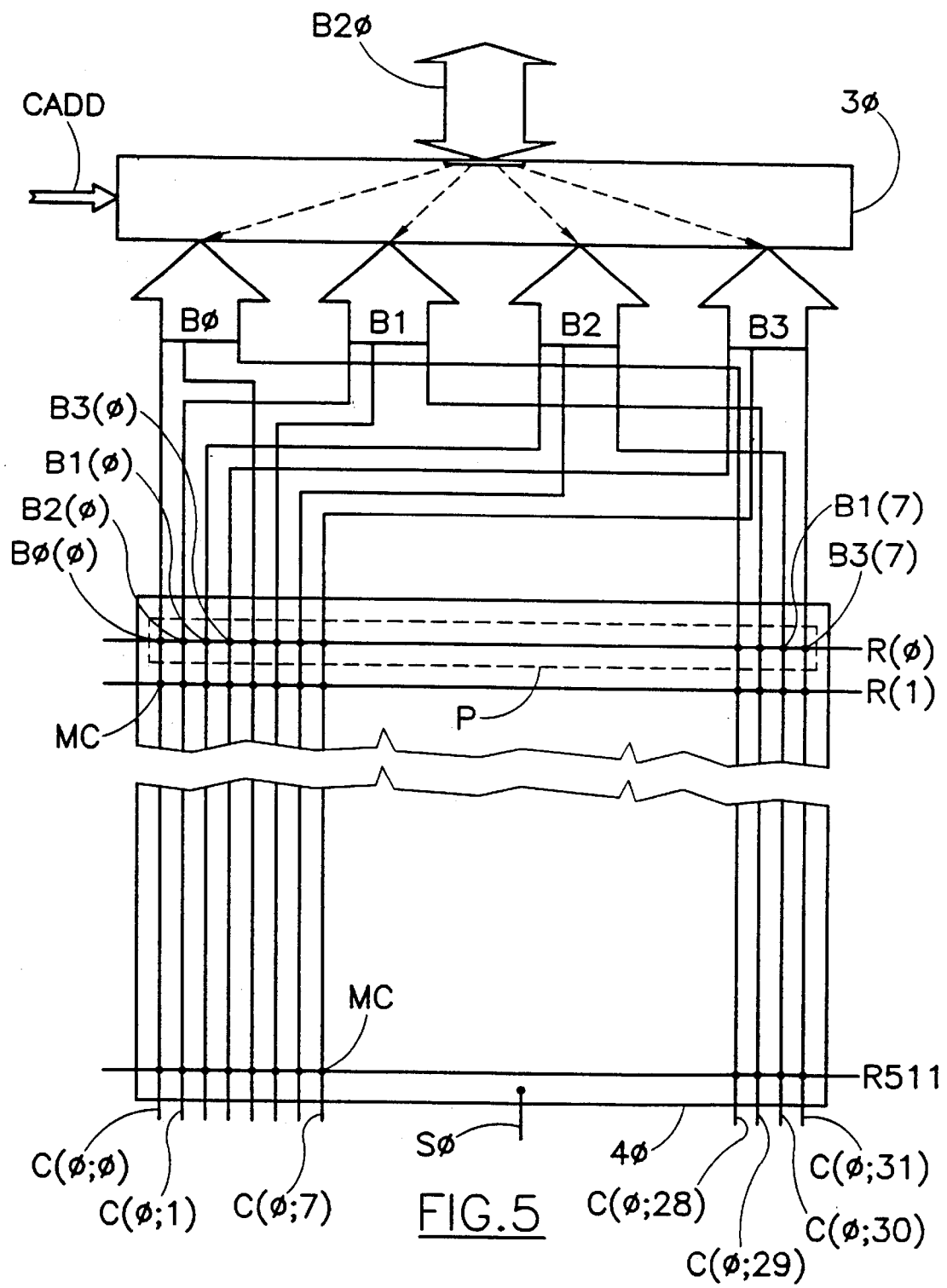
FIG. 5 is a schematic diagram of a first embodiment of the present invention.

Referring to FIG. 5, there is schematically shown by way of example only one stripe 40 of the plurality of stripes 40–4127 depicted in FIG. 1.

The thirty-two columns C(0;0)–C(0;31) of memory cells MC formed inside stripe 40 are scrambled so that, considering a memory page P, bits of said memory page which belong to a same Byte are no more adjacent, but always spaced apart of the maximum distance allowed within the stripe.

Let's call B0, B1, B2 and B3 the four Bytes that make up page P (which, in the example so far considered, includes thirty-two bits). Let's also call Bi(j), with i=0, . . . ,3 and j=0, . . . , 7, the j-th bit of Byte i-th. Than, the correspondence between the columns C(0;0)–C(0;31) and the bits of the various Bytes is the following:

| C(0;0) | C(0;1) | C(0;2) | C(0;3) | C(0;4) | C(0;5) | C(0;6) | C(0;7) |
|---|---|---|---|---|---|---|---|
| B0(0) | B2(0) | B1(0) | B3(0) | B0(1) | B2(1) | B1(1) | B3(1) |
| C(0;8) | C(0;9) | C(0;10) | C(0;11) | C(0;12) | C(0;13) | C(0;14) | C(0;15) |
| B0(2) | B2(2) | B1(2) | B3(2) | B0(3) | B2(3) | B1(3) | B3(3) |
| C(0;16) | C(0;17) | C(0;18) | C(0;19) | C(0;20) | C(0;21) | C(0;22) | C(0;23) |
| B0(4) | B2(4) | B1(4) | B3(4) | B0(5) | B2(5) | B1(5) | B3(5) |
| C(0;24) | C(0;25) | C(0;26) | C(0;27) | C(0;28) | C(0;29) | C(0;30) | C(0;31) |
| B0(6) | B2(6) | B1(6) | B3(6) | B0(7) | B2(7) | B1(7) | B3(7) |

If memory page P is viewed as a unique long word LW of four Bytes, indicating with LW(k), k=0, . . . ,31, the k-th bit of the long word, the same sequence can be written as:

| C(0;0) | C(0;1) | C(0;2) | C(0;3) | C(0;4) | C(0;5) | C(0;6) | C(0;7) |
|---|---|---|---|---|---|---|---|
| LW(0) | LW(16) | LW(8) | LW(24) | LW(1) | LW(17) | LW(9) | LW(25) |
| C(0;8) | C(0;9) | C(0;10) | C(0;11) | C(0;12) | C(0;13) | C(0;14) | C(0;15) |
| LW(2) | LW(18) | LW(10) | LW(26) | LW(3) | LW(19) | LW(11) | LW(27) |
| C(0;16) | C(0;17) | C(0;18) | C(0;19) | C(0;20) | C(0;21) | C(0;22) | C(0;23) |
| LW(4) | LW(20) | LW(12) | LW(28) | LW(5) | LW(21) | LW(13) | LW(29) |
| C(0;24) | C(0;25) | C(0;26) | C(0;27) | C(0;28) | C(0;29) | C(0;30) | C(0;31) |
| LW(6) | LW(22) | LW(14) | LW(30) | LW(7) | LW(23) | LW(15) | LW(31) |

The above arrangement, which can be achieved by providing a suitable scrambling of the columns of any given column packet at the level of column address decoding and column selection, assures that the memory cells which can be written in parallel, i.e. simultaneously, are spaced apart of the maximum distance possible inside the memory page.

Considering for example that the memory is designed to work as a Byte-wide device, with memory locations of the dimension of one Byte each, the memory has a degree of parallelism of eight, so that the number of memory cells that can be read or written in parallel is equal to eight. In this case, the memory cells (i.e., bits Bi(0), Bi(1), . . . ,Bi(7)) making up a given Byte Bi of page P are spaced apart of a distance equal to four times the pitch of the memory cells along the row. This is also the distance between regions of injection of carriers into the substrate. When the content of a Byte of the memory page is to be modified, all the four Bytes of the memory page are first erased, then the memory cells of the first Byte B0 are written, followed by the memory cells of the second B1, third B2 and fourth B3 Bytes, in sequence.

If instead the memory is designed to work as a word-wide (sixteen bits) device, with memory locations of the size of two Bytes each, the memory has a degree of parallelism of sixteen, so that the number of memory cells that can be read or written in parallel is equal to sixteen. Bytes B0 and B1 make up one of the memory words of the memory page, Bytes B2 and B3 make up the other memory word. In this case, the memory cells making up a given memory word of page P are spaced apart of a distance equal to twice the pitch of the memory cells along the row. When the content of a memory word of the memory page is to be modified, the two words of the memory page are firstly erased, then the memory cells of the first memory word (B0,B1) are written, and then the memory cells of the second memory word (B2,B3) are written.

If the memory device is designed to work as a long-word device, with memory locations of the size of thirty-two bits each, with a degree of parallelism both in reading and in writing of thirty-two memory cells, there will be no changes with respect to the arrangement of FIG. 1.

Obviously, the present invention is not limited to the case of memory pages of the size of thirty-two bits. For example, if the memory pages are longer than thirty-two bits, than the scrambling scheme described above shall be propagated so as to keep the memory cells that can be simultaneously written at the maximum distance possible inside the memory page. More generally, let the case be considered that each memory page contains $2^m$ bits. Thus, each column packet contains $2^m$ columns. If $2^n$ (with $n \leq m$) is the degree of parallelism of the memory device, that is, the number of memory cells that can be written simultaneously, the present invention provides for distributing every $2^{(m-n)}$ columns of a column packet those columns of the column packet containing memory cells that, in a write operation, can be written simultaneously.

Even more generally, the present invention is not limited to cases in which the number of bits contained in a given memory page is a power of two. This typically occurs when fail bit correction is implemented by means of an Error Correction Code (ECC), and/or a security access scheme based on flag bits is used.

For example, let the case be considered of a thirty-two data bit memory page (as the one described before), with capability of correcting one fail bit. In this case, using for example a Hamming correction code, six additional bits are necessary: the total number of bits of the memory page (data bits plus ECC bits) amounts to thirty-eight. The six additional ECC bits belong to six additional columns of the column packet.

If the six additional columns are, physically, the last six columns of the column packet (i.e., considering for example first column packet, columns C(0;32)–C(0;37)), an advantageous scrambling scheme provides for associating columns C(0;32) and C(0;36) to the first Byte B0, columns C(0;33) and C(0;37) to the third Byte B2, column C(0;34) to the second Byte B1 and column C(0;35) to the fourth Byte B3. If the memory is designed to work as a Byte-wide device (which however in this case means that the programming circuitry 7 is capable of programming simultaneously up to ten memory cells), then again the memory cells making up a given Byte Bi of the memory page are spaced apart of a distance equal to four times the pitch of the memory cells along the row. If instead the memory is designed to work as a word-wide device (which in this case means that the programming circuitry is capable of programming up to nineteen memory cells), then again the memory cells making up the couples of Bytes (B0,B1) and (B2,B3) are spaced apart of a distance equal to twice the pitch of the memory cells along the row.

Alternatively, the six additional columns can be distributed so that three of them are physically located at one side of the thirty-two columns, and the remaining three are physically located at the other side. In this case, supposing that the memory has a degree of parallelism of eight in writing, the writing sequence of a memory page is made up of five phases: four for programming the for Bytes B0–B3, one for programming the six ECC bits. In this last phase, three adjacent memory cells at one side and three at the other side of the column packet are simultaneously programmed. This however does not pose great problems, since the two groups of three adjacent memory cells are spaced apart from each other of thirty-two memory cells. Moreover, since the two groups of three memory cells are located near the boundary of the respective stripe 40 (where substrate contacts are provided), no significant problems of voltage drops in the substrate arise.

Thanks to the present invention, the problem of reduction of writing efficiency due to variation of the memory cells' substrate potential is minimized, since the memory cells that are simultaneously written, and which potentially inject carriers into the substrate (the respective P type stripes) are spaced apart. So, the degree of parallelism of the memory in writing can be kept high.

The embodiment of the present invention depicted in FIG. 5 only requires to properly modify the layout of the column address decoding and column selection circuit block, making the proper connections to the columns of the array.

Therefore, in this case the implementation of the present invention does not cause any increase in complexity and area of the column address decoding and column selection circuits. Moreover, a gain in area can be achieved because the constraints in the substrate bias contact efficiency can be relaxed: the distance between substrate contact regions can thus be increased, and the number of substrate contact regions be reduced.

Figure 6:
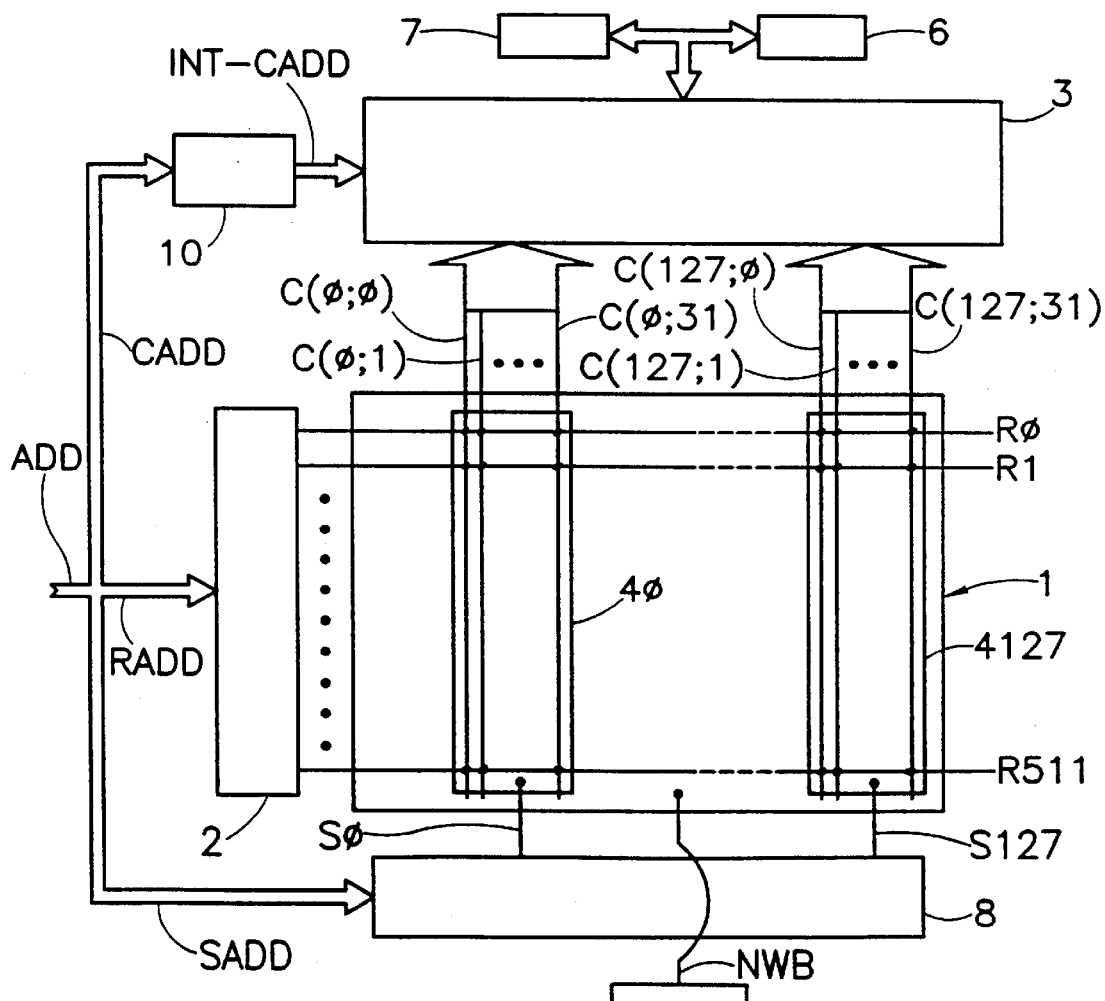
FIG. 6 is a schematic diagram of a second embodiment of the present invention.

In FIG. 6 an alternative embodiment of the present invention is shown. In this embodiment, instead of acting on the layout of the column address decoding and column selection circuits (block 3), a column address scrambling circuit block 10 is provided in the memory. Block 10 is inserted between address input buffers of the memory (the conventional interface circuits through which the address signals of the bus ADD are furnished to the memory device, not shown in the drawing) and the column address decoding and column selection circuit block 3, which in this case are completely similar to those depicted in FIG. 1. Block 10, which can easily be made up of simple logic gates, performs a transformation of digital code: an input digital code carried by bus CADD, corresponding to the column address of a given memory Byte or word, is transformed into an output digital code forming an internal column address. The internal column address, carried by an internal column address signal line bus INT_CADD, is such that, when supplied to the column address decoding and column selection circuits, the same scrambling scheme described in relation to the first embodiment is achieved.

Having thus described at least one illustrative embodiment of the invention, various alterations, modifications, and improvements will readily occur to those skilled in the art. Such alterations, modifications, and improvements are intended to be within the spirit and scope of the invention. For example, the memory may contain more than one two-array of memory cells, each one forming a memory sector. In this case either one, or only some, or all of the memory sectors of the memory could have the structure of the two-array 1 previously described. Accordingly, the foregoing description is by way of example only and is not intended as limiting. The invention is limited only as defined in the following claims and the equivalents thereto.

What is claimed is:

1. A non-volatile, electrically alterable semiconductor memory comprising:

at least one array of memory cells arranged in a plurality of rows and a plurality of columns;

a write circuit for simultaneously writing a selected number of memory cells;

a plurality of doped semiconductor regions extending transversely to the rows and dividing the memory cells of each row into a plurality of subsets of memory cells, each subset of memory cells within the same doped semiconductor region defining an independently erasable memory block;

a plurality of column packets, each column packet comprising at least one column of memory cells, the number of columns of memory cells in each column packet being greater than or equal to the selected number of memory cells; and a column selection circuit for selecting columns of memory cells such that columns of memory cells comprising memory cells that are simultaneously written by said write circuit are distributed among said plurality of column packets so as to be a maximum distance from one another within each column packet.

2. A non-volatile, electrically alterable semiconductor memory according to claim 1 further comprising a doped semiconductor region selection circuit comprising a doped semiconductor region address signal line bus and a doped semiconductor region address decoding and selection circuit for selectively supplying to said plurality of doped semiconductor regions respective biasing voltages based on an operation mode of the memory.

3. A non-volatile, electrically alterable semiconductor memory according to claim 2 further comprising a row selection circuit for selecting at least one row of memory cells from among said plurality of rows during an erase operation to supply a row erase voltage to only the selected at least one row of memory cells.

4. A non-volatile, electrically alterable semiconductor memory according to claim 1 wherein said column selection circuit comprises:

a column address signal line bus for carrying a digital code defining a column address; and column address decoding and column selection circuits for receiving the column address defined by the digital code and, based thereon, selecting a column packet from among said plurality of column packets and selecting a number of columns of memory cells within the selected column packet;

the number of columns of memory cells selected being equal to the selected number of memory cells and the columns of memory cells being distributed among the columns of memory cells of the column packet so as to be a maximum distance from one another within the column packet.

5. A non-volatile, electrically alterable semiconductor memory according to claim 1 wherein said column selection circuit comprises:

a column address signal line bus for carrying an externally-generated digital code defining a column address;

a digital code transformation circuit to generate an internal digital code based on the externally-generated digital code; and column address decoding and column selection circuits for receiving the internal digital code and, based thereon, selecting a column packet and a number of columns of memory cells within the column packet, the number of columns of memory cells selected being equal to the selected number of memory cells;

the generation of the internal digital code such that the columns of memory cells selected are a maximum distance from one another within the column packet.

6. A non-volatile, electrically alterable semiconductor memory according to claim 1 wherein the selected number of said memory cells is equal to $2^n$; wherein the number of columns of memory cells in each column packet is equal to $2^m$; wherein said column selection circuit is such that, within each column packet, columns of memory cells containing memory cells written simultaneously by said write circuit are distributed every $2^{(m+n)}$ columns of the column packet.

7. A memory comprising:

at least one array of memory cells arranged in a plurality of columns and a plurality of rows;

a write circuit to write a selected number of said memory cells;

a plurality of doped semiconductor regions dividing said at least one array of memory cells into a plurality of subsets of memory cells, each subset of memory cells within a doped semiconductor region comprising an independently erasable memory block;

a plurality of column packets, each column packet comprising at least one column of memory cells, the number of columns of memory cells in each column packet being greater than or equal to the selected number of memory cells;

a row selection circuit for selecting at least one row of memory cells from among said plurality of rows during an erase operation to supply a row erase voltage to the selected at least one row of memory cells;

a column selection circuit for selecting columns of memory cells such that columns of memory cells comprising memory cells written by said write circuit are distributed among said plurality of column packets so as to be a maximum distance from one another within each column packet.

8. A memory according to claim 7 further comprising a doped semiconductor region address signal line bus and a doped semiconductor region address decoding and selection circuit to selectively supply to said plurality of doped semiconductor regions respective biasing voltages based on an operation mode.

9. A memory according to claim 7 wherein said column selection circuit comprises:

a column address signal line bus for carrying a digital code defining a column address; and column address decoding and column selection circuits for receiving the column address and, based thereon, performing a selection of a column packet from among said plurality of column packets and a selection of a number of columns of memory cells within the selected column packet;

the number of selected columns of memory cells being equal to said selected number of memory cells and the selected columns of memory cells being distributed among the columns of memory cells of the selected column packet so as to be a maximum distance from one another within the column packet.

10. A memory according to claim 7 wherein said column selection circuit comprises:

a column address signal line bus for carrying an externally-generated digital code defining a column address;

a digital code transformation circuit for generating an internal digital code based on the externally-generated digital code; and column address decoding and column selection circuits for receiving the internal digital code and, based thereon, selecting a column packet and a number of columns of memory cells equal to the selected number of memory cells;

the generation of the internal digital code such that the columns of memory cells selected are a maximum distance from one another within the selected column packet.

11. A memory according to claim 7 wherein the selected number of said memory cells is equal to $2^n$; wherein the number of columns of memory cells in each column packet is equal to $2^m$; wherein said column selection circuit is such that, within each column packet, columns of memory cells containing memory cells written by said write circuit are distributed every $2^{(m+n)}$ columns of the column packet.

12. A method of writing a memory comprising at least one array of memory cells arranged in a plurality of rows and a plurality of columns, a row selection circuit for selecting a row, a column selection circuit for selecting a column, a write circuit for simultaneously writing a selected number of said memory cells, a plurality of doped semiconductor regions subdividing memory cells into a plurality of subsets of memory cells that can each be individually erased, and a plurality of column packets that each contains a number of columns of memory cells less that than the selected number of memory cells, the method comprising:

selecting a row;

selecting a column packet; and for the selected column packet, selecting a number of columns, the columns containing memory cells that are written simultaneously by the write circuit such that the selected columns are distributed among the columns of the column packet to be at a maximum distance from each other within each column packet.

13. A method according to claim 12 wherein the number of columns is equal to the selected number of memory cells.

14. A method according to claim 12 wherein the selected number of memory cells is equal to $2^n$; wherein the number of columns of memory cells in each column packet is equal to $2^m$; wherein the column selection circuit is such that, within each column packet, columns of memory cells containing memory cells written by the write circuit are distributed every $2^{(m+n)}$ columns of the column packet.

* * * * *

UNITED STATES PATENT AND TRADEMARK OFFICE
CERTIFICATE OF CORRECTION

PATENT NO. : 6,618,315 B2
DATED : September 9, 2003
INVENTOR(S) : Pio et al.

It is certified that error appears in the above-identified patent and that said Letters Patent is hereby corrected as shown below:

<u>Title page,</u>
Item [75], Inventor, insert -- (MI) -- between "Brugherio" and "(IT)"; and delete "Padua" insert -- Padova --
Item [73], Assignee, insert -- (MI) -- between "Brianza" and "(IT)"
Item [56], References Cited, U.S. PATENT DOCUMENTS, insert
-- 2002/0159300 10/2002 Fujimoto 365/189.05
  2002/0149970 10/2002 Fujimoto 365/189.05
  2002/0149969 10/2002 Fujimoto 365/189.05
  6,449,196 9/2002 Fujimoto 365/189.05
  6,301,160 10/2001 Fujimoto 365/189.05 --

<u>Column 2,</u>
Line 21, insert -- of -- between "distribution" and "the"

<u>Column 4,</u>
Line 27, insert -- . -- after "each"
Line 32, delete "R0-R11" insert -- R0-R511 --

<u>Column 9,</u>
Line 18, delete "for" after "the"

Signed and Sealed this

Twenty-third Day of December, 2003

JAMES E. ROGAN
*Director of the United States Patent and Trademark Office*